(12) United States Patent
Tatsumi et al.

(10) Patent No.: US 7,579,915 B2
(45) Date of Patent: Aug. 25, 2009

(54) ELECTRONIC CIRCUIT

(75) Inventors: Taizou Tatsumi, Yamanashi (JP); Sosaku Sawada, Yamanashi (JP)

(73) Assignee: Eudyna Devices Inc., Yamanashi (JP)

( * ) Notice: Subject to any disclaimer, the term of this patent is extended or adjusted under 35 U.S.C. 154(b) by 25 days.

(21) Appl. No.: 11/727,960

(22) Filed: Mar. 29, 2007

(65) Prior Publication Data

US 2007/0229172 A1  Oct. 4, 2007

(30) Foreign Application Priority Data

Mar. 30, 2006 (JP) ............................. 2006-094713

(51) Int. Cl.
   *H03F 3/08* (2006.01)
(52) U.S. Cl. ................. 330/308; 250/214 AG
(58) Field of Classification Search ............. 250/214 A, 250/214 AG; 330/308
   See application file for complete search history.

(56) References Cited

U.S. PATENT DOCUMENTS

| | | | | |
|---|---|---|---|---|
| 4,415,803 A | * | 11/1983 | Muoi | ..................... 250/214 A |
| 4,620,321 A | * | 10/1986 | Chown | ........................ 398/202 |
| 4,679,251 A | * | 7/1987 | Chown | ........................ 398/202 |
| 4,939,475 A | | 7/1990 | Prasse et al. | |
| 5,646,573 A | * | 7/1997 | Bayruns et al. | ................ 330/59 |
| 6,081,558 A | * | 6/2000 | North | ......................... 375/316 |

FOREIGN PATENT DOCUMENTS

| | | |
|---|---|---|
| DE | 3543677 | 6/1987 |
| JP | 2003-258580 A | 9/2003 |
| WO | WO 99/28768 A | 10/1999 |

* cited by examiner

*Primary Examiner*—Steven J Mottola
(74) *Attorney, Agent, or Firm*—Westerman, Hattori, Daniels & Adrian, L.L.P.

(57) ABSTRACT

An electronic circuit includes: a control circuit that controls the gain of a transimpedance amplifier by taking part of an input current to be input to the transimpedance amplifier, based on the output voltage of the transimpedance amplifier; and a PIN diode that is provided between an input of the transimpedance amplifier and the control circuit, and is connected in the forward direction with respect to the current to be drawn into the control circuit.

10 Claims, 3 Drawing Sheets

| | Iin=0mA |
|---|---|
| | Iin=0.1mA |
| | Iin=0.5mA |
| | Iin=1.0mA |
| | Iin=2.0mA |

ELECTRONIC CIRCUIT

BACKGROUND OF THE INVENTION

1. Field of the Invention

The present invention generally relates to an electronic circuit, and more particularly, to an electronic circuit that has a transimpedance amplifier.

2. Description of the Related Art

A transimpedance amplifier (TIA) is an amplifier circuit that converts current into voltage and amplifies the voltage. Such a transimpedance amplifier is used for optical communications, for example. On the light receiving side of an optical communication, a light receiving element such as a photodiode converts light transmitted through an optical fiber into a current. A TIA amplifies the current output from the light receiving element, and outputs the amplified current as a voltage signal. The input to the TIA includes an input current that is a DC component, and an input signal that is a high-frequency component. There is an input current range within which the TIA can amplify the current output with precision. Accordingly, when the amount of input current changes greatly, the TIA cannot amplify the input signal with high precision. Therefore, some TIAs have automatic gain control (AGC) circuits. An AGC circuit controls the gain of a TIA, based on the output voltage of the TIA. When the output voltage of the TIA is low, the AGC circuit does not control the gain. However, as the output voltage increases, the AGC circuit reduces the gain of the TIA. In this manner, an amplifier that can amplify a small input current as well as a large input current with high precision can be realized. The output current of a light receiving element is amplified by a TIA circuit equipped with an AGC circuit, so that weak optical signals as well as strong optical signals can be amplified with high precision. Japanese Unexamined Patent Publication No. 2003-258580 discloses a TIA circuit that has an AGC circuit.

In a TIA having an AGC circuit, the AGC circuit is expected to have greater effects. More specifically, the AGC circuit is expected to control transimpedance as a gain more effectively.

SUMMARY OF THE INVENTION

It is therefore an object of the present invention to provide an electronic circuit in which the above disadvantage is eliminated.

A more specific object of the present invention is to provide an electronic circuit that has an AGC circuit (a control circuit) capable of controlling the gain of a transimpedance amplifier more effectively.

According to an aspect of the present invention, there is provided an electronic circuit including: a control circuit that controls a gain of a transimpedance amplifier by taking part of an input current to be input to the transimpedance amplifier, based on an output voltage of the transimpedance amplifier; and a PIN diode that is provided between an input of the transimpedance amplifier and the control circuit, and is connected in a forward direction with respect to the current to be drawn into the control circuit. With this structure, the control circuit can control the gain of the transimpedance amplifier more effectively.

The electronic circuit may be configured so that the input current is an output current from a light receiving element.

The electronic circuit may be configured so that an undoped semiconductor layer provided between a cathode layer and an anode layer of the PIN diode has the same film thickness as an undoped semiconductor layer provided between a cathode layer and an anode layer of a PIN photodiode serving as the light receiving element. With this structure, a PIN diode and a PIN photodiode can be formed on the same substrate. Accordingly, integration can be achieved. Further, the undoped semiconductor layer of the PIN diode can be made thick. Thus, the control circuit can control the gain of the transimpedance amplifier more effectively also on the low frequency side.

The electronic circuit may be configured so that an undoped semiconductor layer provided between a cathode layer and an anode layer of the PIN diode has the same film thickness as an undoped semiconductor layer provided between a base layer and a collector layer of a bipolar transistor that forms at least one of the transimpedance amplifier and the control circuit. With this structure, a PIN diode and at least one of a transimpedance amplifier and a control circuit can be formed on the same substrate. Thus, circuit integration can be achieved.

The electronic circuit may be configured so that the PIN diode, the light receiving element, and at least one of the transimpedance amplifier and the control circuit are formed on the same substrate. With this structure, higher circuit integration can be achieved.

The electronic circuit may be configured so that the control circuit draws the part of the input current thereinto when a voltage relative to the output voltage is equal to or higher than a predetermined voltage. The electronic circuit may be configured so that the voltage relative to the output voltage is a voltage obtained by smoothing the output voltage.

As described above, the present invention can provide an electronic circuit that has an AGC circuit (a control circuit) capable of controlling the gain of a transimpedance amplifier more effectively.

BRIEF DESCRIPTION OF THE DRAWINGS

Other objects, features and advantages of the present invention will become more apparent from the following detailed description when read in conjunction with the accompanying drawings, in which.

DESCRIPTION OF THE PREFERRED EMBODIMENTS

The following is a description of embodiments of the present invention, with reference to the accompanying drawings.

First Embodiment

Figure 1:
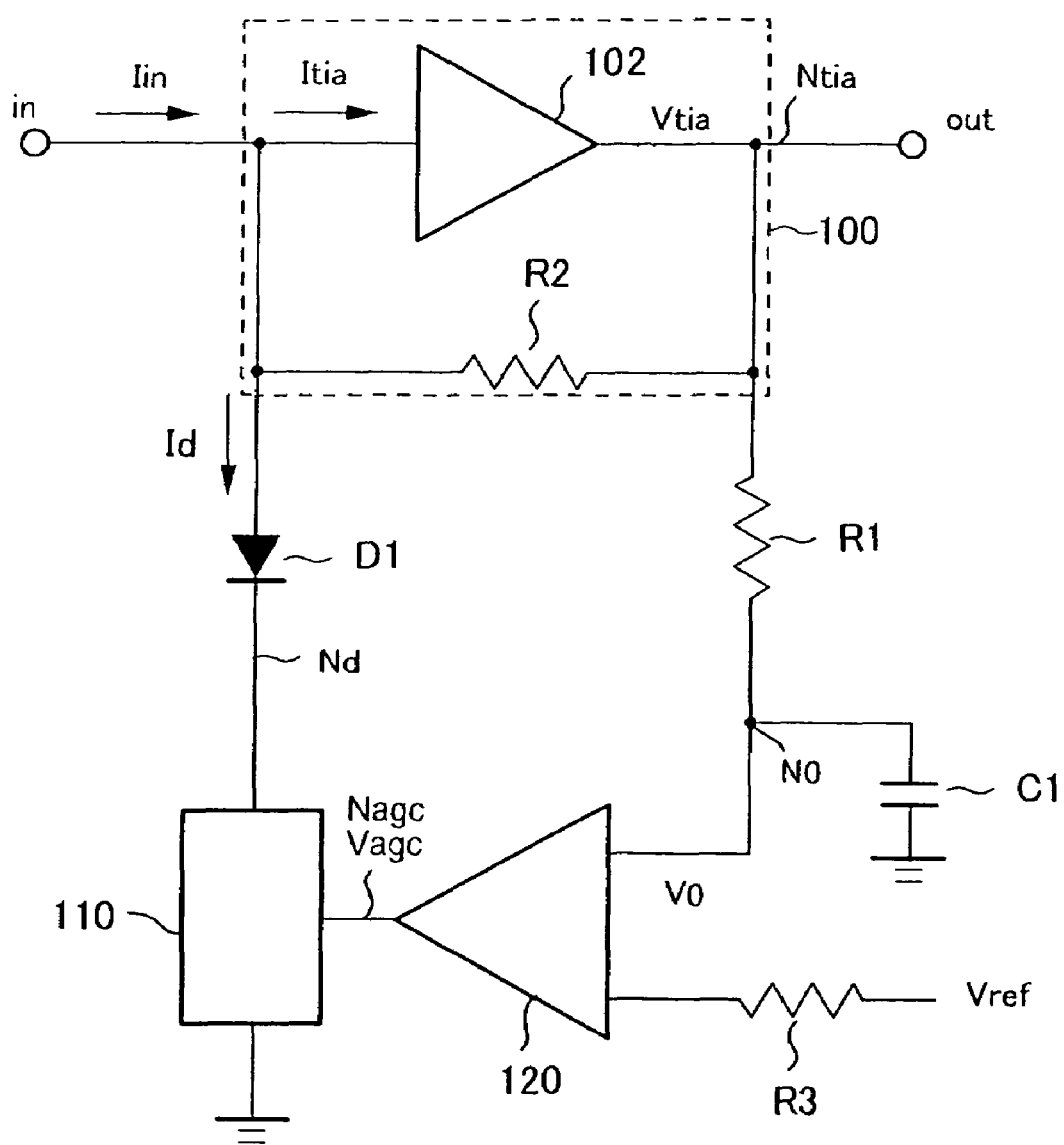
FIG. 1 is a circuit diagram in accordance with a first embodiment of the present invention.

FIG. 1 is a circuit diagram of a transimpedance amplifier that has an AGC circuit (a control circuit 110) in accordance with a first embodiment of the present invention. An input current Iin that is an output current from a light receiving element, for example, is input to a TIA 100. An input signal and an input current Itia are input to the TIA 100. In the TIA 100, an amplifier 102 and a feedback resistor R2 are provided in parallel. An output voltage Vtia of the TIA 100 is output to a node Ntia. The voltage Vtia is smoothed by a low pass filter formed with a resistor R1 and a capacitor C1, and becomes a voltage V0 of a node N0. The voltage V0 is a voltage corresponding to the input current Itia that is a DC component of the input to the TIA 100. The voltage V0 of the node N0 is input to a differential amplifier circuit 120. A reference voltage Vref is also input to the differential amplifier circuit 120 via a resistor R3. The differential amplifier circuit 120 differentially amplifies the smoothed voltage V0 and the reference voltage Vref, and outputs a voltage Vagc to the control circuit 110. The input "in" to the TIA 100 is connected to the control circuit 110 via a diode D1. The control circuit 110 is a transistor that is connected between a node Nd and a ground, for example.

When the voltage Vagc to be input to the control circuit 110 becomes higher, the current Id to flow from the input "in" of the TIA 100 to the ground via the node Nd is made larger. When the voltage Vagc becomes lower, the current Id is made smaller. In a case where the voltage V0 (voltage obtained by smoothing the output voltage Vout) relative to the output voltage Vout is equal to or higher than the reference voltage Vref (based on the output voltage Vout of the TIA 100), part of the input current un at the input "in" of the TIA 100 is drawn as the current Id into the control circuit 110. In this manner, the current Itia to be input to the TIA 100 is smaller. In other words, the current Id is obtained by dividing the input current Iin at the input "in", so that the input current Itia to be input to the TIA 100 is smaller. In this manner, the control circuit 110 controls the gain of the TIA 100. In a case where the control circuit 110 allows the current Id to flow, the diode D1 is located in the forward direction. In a case where the control circuit 110 does not allow the current Id to flow, the impedance becomes high, and the isolation of the control circuit 110 seen from the input "in" is increased.

Figure 2A:
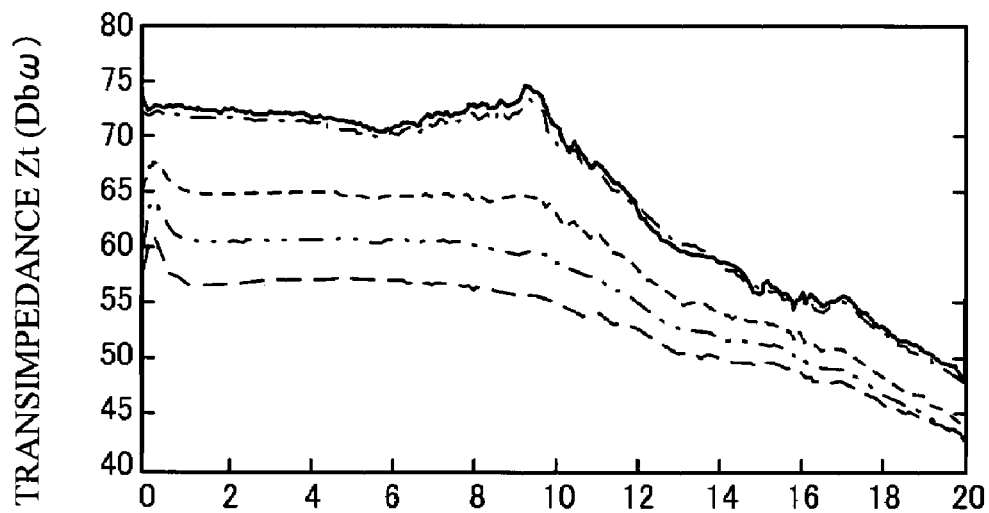
FIGS. 2A and 2B show the frequency dependence of the transimpedance of an electronic circuit as a comparative example and the frequency dependence of the transimpedance of the electronic circuit of the first embodiment.
Figure 2B:
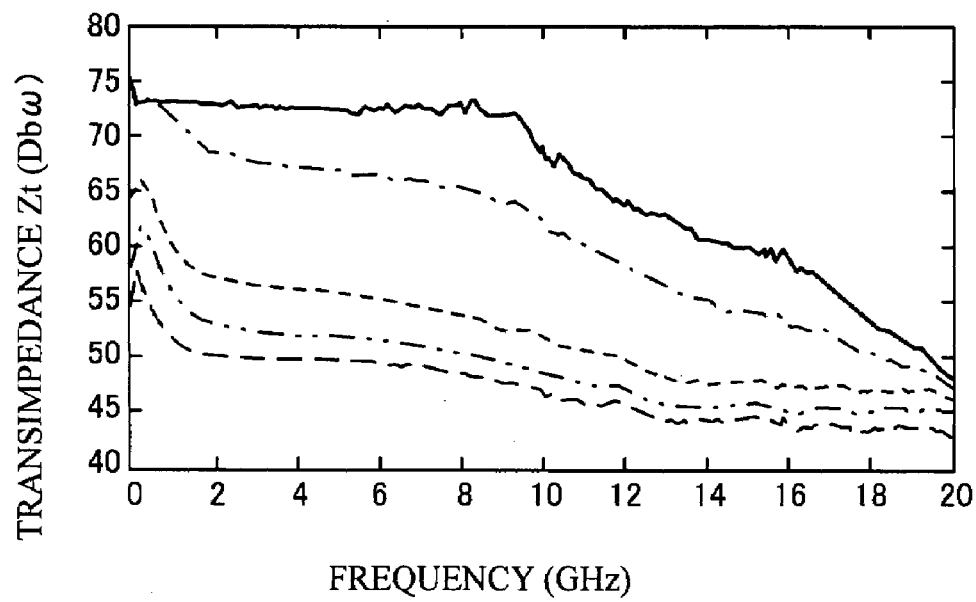

FIGS. 2A and 2B show the results of measurement of the transimpedance Zt of the electronic circuit shown in FIG. 1 with respect to the frequency in cases where a PN diode and a PIN diode are used as the diode D1, respectively. A PN diode is a diode that is formed with the base layer and the emitter layer of a HBT (hetero bipolar transistor) that serves as the TIA 100 and the control circuit 110. A PIN diode is a diode that is formed with the base layer and the collector layer of a HBT that serves as the TIA 100 and the control circuit 110. The respective lines shown in each of FIGS. 2A and 2B indicate the frequency dependence of the transimpedance Zt where the input current Iin to the input "in" is 0 mA, 0.1 mA, 0.5 mA, 1.0 mA, and 2.0 mA. Where the input current Iin to the input "in" is 0 mA, the control circuit 110 is not operating (in other words, the control circuit 110 does not allow the current Id to flow). In this case, the frequency dependence of the transimpedance Zt remains substantially the same whether the diode D1 is a PN diode or a PIN diode.

Where the input current Iin to the input "in" is 0.1 mA or larger, the control circuit 110 is operating (or the control circuit 110 allows the current Id to flow). Here, the transimpedance Zt observed where a PIN diode is used is approximately 7 dB lower than the transimpedance Zt observed where a PN diode is used. As can be seen from this result, the transimpedance Zt of the TIA 100 can be reduced by using a PIN diode as the diode D1 that is provided between the input "in" of the TIA 100 and the control circuit 110 and is connected in the forward direction with respect to the current Id to be drawn into the control circuit 110. In this manner, the control circuit 110 can further control the gain of the TIA 100.

In other words, the control circuit 110 functions as an AGC circuit. This results from the fact that the impedance of a PIN diode in the forward direction is lower than that of a PN diode.

Figure 3:
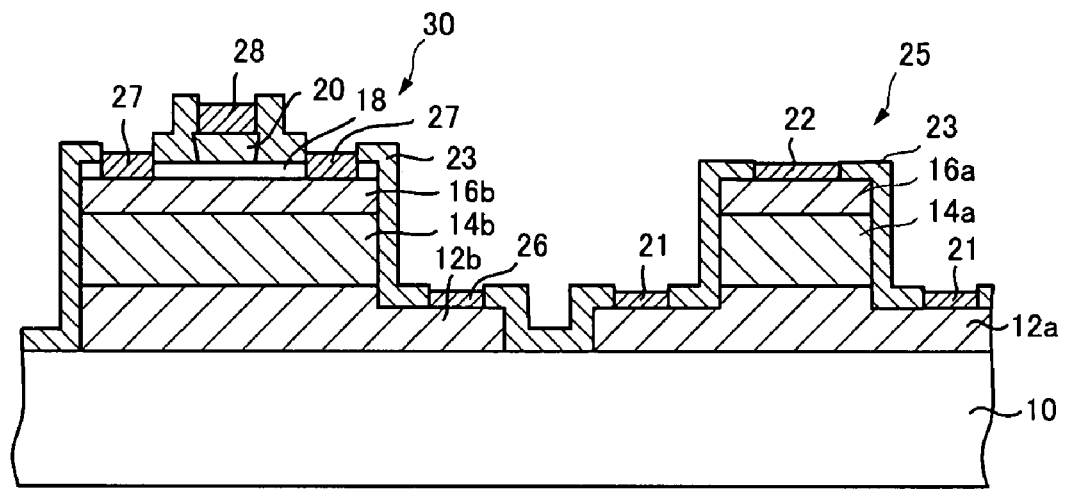
FIG. 3 is a schematic cross-sectional view of the diode and the HBT of the electronic circuit in accordance with the first embodiment.

FIG. 3 is a schematic cross-sectional view of the HBT that forms the PIN diode D1, the TIA 100, and the control circuit 110. A PIN diode 25 and a HBT 30 are formed on an InP substrate 10. The PIN diode 25 is formed on the semi-insulating InP substrate 10, and has a stack structure formed with a highly-doped n-type GaInAs cathode layer 12a that has a dope amount of $1 \times 10^{19}$ cm$^{-3}$ and is 300 nm in film thickness, an undoped (intrinsic) GaInAs semiconductor layer 14a that is 400 nm in film thickness, and a p-type GaInAs anode layer 16a that has a dope amount of $8 \times 10^{18}$ cm$^{-3}$ and is 300 nm in film thickness, for example. Anode electrodes 21 are formed on the cathode layer 12a, and a cathode electrode 22 is formed on the anode layer 16a. The HBT 30 is formed on the semi-insulating InP substrate 10, and has a stack structure formed with a highly-doped n-type GaInAs collector layer 12b, an undoped GaInAs semiconductor layer 14b, a p-type GaInAs base layer 16b, an n-type InP emitter layer 18, and an emitter contact layer 20. A collector electrode 26 is formed on the collector layer 12b, base electrodes 27 are formed on the base layer 16b, and an emitter electrode 28 is formed on the emitter contact layer 20. The semiconductor layers are covered with a protection film 23 made of silicon nitride film, for example.

In the structure shown in FIG. 3, the n-type cathode layer 12a and the n-type collector layer 12b on the InP substrate 10 are formed at the same time. The undoped semiconductor layer 14a and the undoped semiconductor layer 14b are also formed at the same time, and the p-type anode layer 16a and the p-type base layer 16b are also formed at the same time. Accordingly, the film thicknesses, the compositions, and the dope concentrations of the layers of the PIN diode 25 are the same as those of the corresponding layers of the HBT 30. Accordingly, the undoped semiconductor layer 14a provided between the anode layer 16a and the cathode layer 12a of the PIN diode 25 has the same film thickness as the undoped semiconductor layer 14b provided between the base layer 16b and the collector layer 12b of the HBT (bipolar transistor) 30 that forms at least one of the transimpedance amplifier 100 and the control circuit 110.

In this manner, the control circuit 110 can control the gain of the TIA 100 more effectively than in a case where a diode is formed with the emitter layer and the base layer of a HBT, as described above with reference to FIGS. 2A and 2B. Also, the circuit in accordance with the first embodiment can be formed by integrating the diode D1, the transimpedance amplifier 100 and the control circuit 110 on the same substrate 10. The PIN diode D1 shares the above layers with at least one of the transimpedance amplifier 100 and the control circuit 110, so that the circuit shown in FIG. 3 can be formed. Also, the resistors R1 through R3 and the capacitor C1 can also be integrated on the substrate 10.

Second Embodiment

Figure 4:
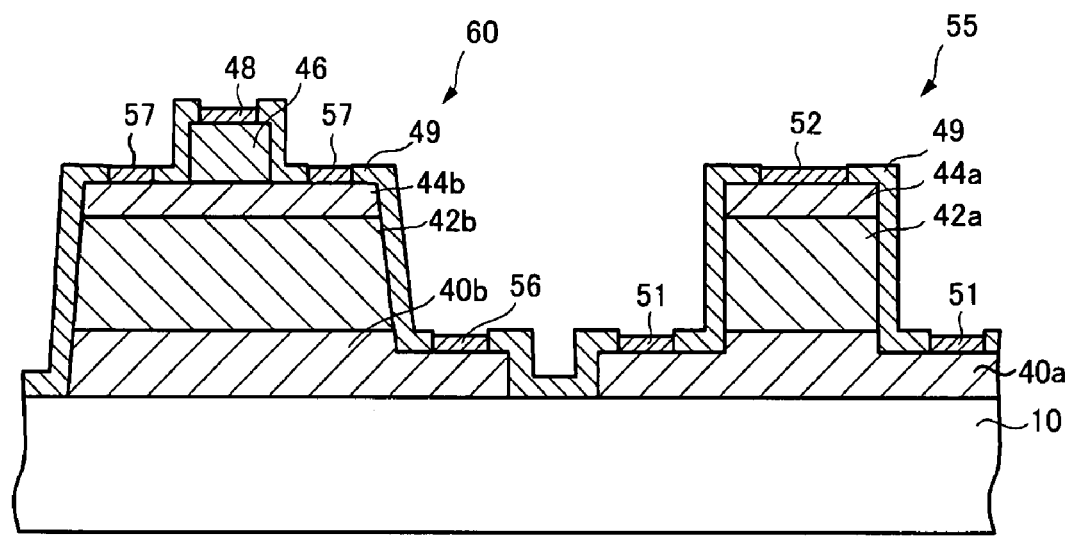
FIG. 4 is a schematic cross-sectional view of the diode and the light receiving element of an electronic circuit in accordance with a second embodiment of the present invention.

A second embodiment of the present invention is an example case where a PIN diode and a light receiving element are formed with common layers. The circuit structure of this embodiment is the same as the structure shown in FIG. 1, and explanation of it is omitted herein. FIG. 4 is a schematic cross-sectional view of a PIN diode 55 as an electronic circuit and a PIN photodiode 60 as a light receiving element in accordance with the second embodiment. The PIN diode 55 and the PIN photodiode 60 are formed on an InP substrate 10. The PIN diode 55 is formed on the semi-insulating InP substrate 10, and has a stack structure formed with an n-type GaInAs cathode layer 40a that has a dope amount of $1\times10^{19}\text{cm}^{-3}$ and is 300 nm in film thickness, an undoped GaInAs semiconductor layer 42a that is 2500 nm in film thickness, and a p-type GaInAs anode layer 44a that has a dope amount of $8\times10^{18}\text{cm}^{-3}$ and is 300 nm in film thickness, for example. Cathode electrodes 51 are formed on the cathode layer 40a, and an anode electrode 52 is formed on the anode layer 44a. The PIN photodiode 60 is formed on the semi-insulating InP substrate 10, and has a stack structure formed with an n-type GaInAs cathode layer 40b, an undoped GaInAs semiconductor layer 42b, a p-type GaInAs anode layer 44b, and an undoped InP window layer 46. An n-type contact electrode 56 is formed on the n-type cathode layer 40b, and p-type contact electrodes 57 are formed on the p-type anode layer 44b. A reflection preventing film 48 is formed on the window layer 46, and the semiconductor layers are covered with a protection film 49.

In the structure shown in FIG. 4, the n-type cathode layer 40a and the n-type cathode layer 40b are formed on the InP substrate 10 at the same time. Likewise, the undoped semiconductor layer 42a and the undoped semiconductor layer 42b are formed at the same time, and the p-type anode layer 44a and the p-type anode layer 44b are formed at the same time. Accordingly, the film thicknesses, the compositions, and the dope concentrations of the layers of the PIN diode 55 are the same as those of the corresponding layers of the PIN photodiode 60. Accordingly, the undoped semiconductor layer 42a provided between the anode layer 44a and the cathode layer 40a of the PIN diode 55 has the same film thickness as the undoped semiconductor layer 42b provided between the anode layer 44b and the cathode layer 40b of the PIN photodiode 60 that is a light receiving element.

In this manner, the diode D1 and a light receiving element can be formed on the same substrate 10. Thus, integration can be achieved. Further, the undoped semiconductor layer 42b of the PIN photodiode 60 is thicker than the undoped semiconductor layer 14b of the HBT 30. Accordingly, the undoped semiconductor layer 42a of the PIN diode 55 can be made thicker than the undoped semiconductor layer 14a of the PIN diode 25 of the first embodiment. Thus, the impedance of the PIN diode 55 in the forward direction can be made lower than the impedance of the PIN diode 25. Further, in a case where the input current un at the input "in" is 0.5 mA or larger in FIG. 2B, the transimpedance Zt becomes higher when the frequency is 2 GHz or lower. This is because the frequency characteristics of the PIN diode affect the input current un. In accordance with the second embodiment, the undoped semiconductor layer 42a of the PIN diode 55 can be made thicker. Accordingly, the impedance of the PIN diode 55 on the low frequency side can be made lower. Thus, the control circuit 110 can control the gain of the TIA 100 effectively also on the low frequency side.

Alternatively, it is possible to form the PIN diode D1, a light receiving element, and a bipolar transistor that forms at least one of the transimpedance amplifier 100 and the control circuit 110, on the same substrate. In other words, the InP substrate 10 in the structure shown in FIG. 3 can also serve as the InP substrate 10 shown in FIG. 4. In this case, the PIN diode D1 can share the respective layers with the bipolar transistor or the light receiving element. Accordingly, further circuit integration can be achieved. The PIN diode 25 and the HBT 30 formed on the InP substrate 10 have been described as an example of the electronic circuit in accordance with the first embodiment. The PIN diode 55 and the PIN photodiode 60 formed on the InP substrate 10 have been described as an example of the electronic circuit in accordance with the second embodiment. Since a PIN diode has low impedance in the forward direction, any PIN diode other than the above PIN diodes taken as examples may be used in the present invention.

Although a few preferred embodiments of the present invention have been shown and described, it would be appreciated by those skilled in the art that changes may be made in these embodiments without departing from the principles and spirit of the invention, the scope of which is defined in the claims and their equivalents.

The present application is based on Japanese Patent Application No. 2006-094713 filed Mar. 30, 2006, the entire disclosure of which is hereby incorporated by reference.

What is claimed is:

1. An electronic circuit comprising:
a control circuit that controls a gain of a transimpedance amplifier by taking part of an input current to be input to the transimpedance amplifier, based on an output voltage of the transimpedance amplifier;
a differential amplifier; and
a PIN diode that is provided between an input of the transimpedance amplifier and the control circuit, and is connected in a forward direction with respect to the current to be drawn into the control circuit,
wherein an input terminal of said differential amplifier is in communication with an output of said transimpedance amplifier, and another input of said differential amplifier is in communication with a reference voltage; wherein an output of said differential amplifier is connected to an input of said control circuit;
wherein the input current is an output current from a light receiving element; and
wherein an undoped semiconductor layer provided between a cathode layer and an anode layer of the PIN diode has the same film thickness as an undoped semiconductor layer provided between a cathode layer and an anode layer of a PIN photodiode serving as the light receiving element.

2. An electronic circuit comprising:
a control circuit that controls a gain of a transimpedance amplifier by taking part of an input current to be input to the trans impedance amplifier, based on an output voltage of the transimpedance amplifier;
a differential amplifier; and
a PIN diode that is provided between an input of the transimpedance amplifier and the control circuit, and is connected in a forward direction with respect to the current to be drawn into the control circuit,
wherein an input terminal of said differential amplifier is in communication with an output of said transimpedance amplifier, and another input of said differential amplifier is in communication with a reference voltage; wherein an output of said differential amplifier is connected to an input of said control circuit, and
wherein an undoped semiconductor layer provided between a cathode layer and an anode layer of the PIN diode has the same film thickness as an undoped semiconductor layer provided between a base layer and a collector layer of a bipolar transistor that forms at least one of the transimpedance amplifier and the control circuit.

3. An electronic circuit comprising:
a control circuit that controls a gain of a transimpedance amplifier by taking part of an input current to be input to the transimpedance amplifier, based on an output voltage of the transimpedance amplifier;
a differential amplifier; and a PIN diode that is provided between an input of the transimpedance amplifier and the control circuit, and is connected in a forward direction with respect to the current to be drawn into the control circuit, wherein an input terminal of said differential amplifier is in communication with an output of said transimpedance amplifier, and another input of said differential amplifier is in communication with a reference voltage; wherein an output of said differential amplifier is connected to an input of said control circuit, wherein the input current is an output current from a light receiving element, and wherein the PIN diode, the light receiving element, and at least one of the transimpedance amplifier and the control circuit are formed on the same substrate.

4. The electronic circuit as claimed in claim 2, wherein the input current is an output current from a light receiving element.

5. The electronic circuit as claimed in claim 1, wherein the control circuit draws the part of the input current thereinto when a voltage relative to the output voltage is equal to or higher than a predetermined voltage.

6. The electronic circuit as claimed in claim 5, wherein the voltage relative to the output voltage is a voltage obtained by smoothing the output voltage.

7. The electronic circuit as claimed in claim 2, wherein the control circuit draws the part of the input current thereinto when a voltage relative to the output voltage is equal to or higher than a predetermined voltage.

8. The electronic circuit as claimed in claim 7, wherein the voltage relative to the output voltage is a voltage obtained by smoothing the output voltage.

9. The electronic circuit as claimed in claim 3, wherein the control circuit draws the part of the input current thereinto when a voltage relative to the output voltage is equal to or higher than a predetermined voltage.

10. The electronic circuit as claimed in claim 9, wherein the voltage relative to the output voltage is a voltage obtained by smoothing the output voltage.

* * * * *